United States Patent
Alpert et al.

(10) Patent No.: US 6,560,752 B1
(45) Date of Patent: May 6, 2003

(54) APPARATUS AND METHOD FOR BUFFER LIBRARY SELECTION FOR USE IN BUFFER INSERTION

(75) Inventors: Charles Jay Alpert, Austin, TX (US); Rama Gopal Gandham, Wappinger Falls, NY (US); Jose Luis Pontes Correia Neves, Wappinger Falls, NY (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 09/611,670

(22) Filed: Jul. 6, 2000

(51) Int. Cl.[7] .............................................. G06F 17/50
(52) U.S. Cl. ...................... 716/2; 716/5; 716/6; 716/8; 716/10; 716/17; 327/293
(58) Field of Search ........................................ 716/1–21

(56) References Cited

U.S. PATENT DOCUMENTS

| | | | | |
|---|---|---|---|---|
| 5,210,699 A | * | 5/1993 | Harrington | 716/5 |
| 5,410,491 A | * | 4/1995 | Minami | 716/6 |
| 5,432,707 A | * | 7/1995 | Leung | 716/2 |
| 5,459,673 A | * | 10/1995 | Carmean et al. | 716/6 |
| 5,513,119 A | * | 4/1996 | Moore et al. | 716/8 |
| 5,519,351 A | * | 5/1996 | Matsumoto | 327/293 |
| 5,666,288 A | * | 9/1997 | Jones et al. | 716/17 |
| 5,798,935 A | * | 8/1998 | Doreswamy et al. | 716/6 |
| 5,799,170 A | * | 8/1998 | Drumm et al. | 716/2 |
| 5,894,421 A | * | 4/1999 | Yamaguchi et al. | 716/6 |
| 5,974,245 A | * | 10/1999 | Li et al. | 716/10 |
| 6,145,116 A | * | 11/2000 | Tawada | 716/6 |
| 6,347,393 B1 | * | 2/2002 | Alpert et al. | 716/2 |
| 6,367,051 B1 | * | 4/2002 | Pileggi et al. | 716/2 |
| 6,367,060 B1 | * | 4/2002 | Cheng et al. | 716/10 |

* cited by examiner

Primary Examiner—Matthew Smith
Assistant Examiner—Andrea Liu
(74) Attorney, Agent, or Firm—Duke W. Yee; Casimer K. Salys; Stephen J. Walder, Jr.

(57) ABSTRACT

An apparatus and method for buffer selection for use in buffer insertion is provided. An optimal buffer library generator module operates to reduce a general buffer library down to a optimal buffer library based on parameters that are input to the optimal buffer library generator module. Based on these parameters, the optimal buffer library generator module selects buffers from the general buffer library for inclusion in an optimal buffer library. In a preferred embodiment, the optimal buffer library is generated by generating a set of superior buffers and inverters and clustering the set of superior buffers. A single buffer is then selected from each cluster for inclusion in the optimal buffer library. The result is a smaller buffer library which will provide approximately the same performance during buffer insertion while reducing the amount of computing time and memory requirements.

47 Claims, 5 Drawing Sheets

APPARATUS AND METHOD FOR BUFFER LIBRARY SELECTION FOR USE IN BUFFER INSERTION

BACKGROUND OF THE INVENTION

1. Technical Field

The present invention is directed to an apparatus and method for buffer library selection for use in buffer insertion. In particular, the present invention is directed to an apparatus and method for generating a reduced set of buffers for use during buffer insertion to minimize computational time.

2. Description of Related Art

Buffer insertion has become a critical optimization technique in high performance design. Buffer insertion is used as a means for eliminating long wire connections found in many chip designs, such as Application Specific Integrated Circuit (ASIC) chip designs. An ASIC is a chip that is custom designed for a specific application rather than a general-purpose chip such as a microprocessor. The use of ASICs improve performance over general-purpose CPUs, because ASICs are "hardwired" to do a specific job and do not incur the overhead of fetching and interpreting stored instructions. An ASIC chip performs an electronic operation as fast as it is possible to do so, providing, of course, that the circuit design is efficiently architected.

It has been found that buffers can be used to optimize chip designs by eliminating long wire connections that may cause delay along timing-critical paths. Buffers can be used not only to improve delay along timing-critical paths, but also to sharpen slew rates and fix capacitance and noise violations present in chip designs. Consequently, design automation tools which can effectively and efficiently insert buffers into the chip design are essential to the design environment.

There have been several techniques for buffer insertion proposed. The initially proposed technique by Van Guinean in "Buffer Placement in Distributed RC-tree Networks for Minimal Elmore Delay," Intl. Symposium on Circuits and Systems, 1990, pp. 865–868, made use of a single buffer to perform buffer insertion. Since then, various enhancements to this technique have been made.

These enhanced techniques make use of an extensive buffer library B that handles a plurality of buffers and inverting buffers as well. Thus, with these enhanced techniques, rather than passing a single buffer specification into a buffer insertion algorithm, an entire library of buffers is passed to the buffer insertion algorithm. Therefore, using a buffer library instead of a single buffer increases the time complexity and memory usage of the buffer insertion algorithm by a factor of $B^2$.

Modern design libraries may contain hundreds of different buffers, which may be both inverting and non-inverting. Not only are several power levels available for each general buffer and inverting buffer, but specialized clock buffers and low voltage gates may be available as well. If a user supplies all possible buffers as input to a buffer insertion algorithm, the algorithm will take several days or weeks to run to completion on a large design if it does not run out of memory first.

Thus, it would be beneficial to have an apparatus and method for selecting a reduced size buffer library for use with a buffer insertion tool such that the reduced size buffer library is of a size that is manageable by a buffer insertion tool, does not require extensive computational time and memory requirements, and adequately reflects the set of buffers in a general buffer library.

SUMMARY OF THE INVENTION

The present invention provides an apparatus and method for buffer selection for use in buffer insertion. With the apparatus and method of the present invention, a design module receives a high-level design specification from a user and generates a chip design based on the high-level design specification. The design specification is input to a buffer insertion tool module which takes the design specification and inserts appropriate buffers into the design to minimize delay along timing-critical paths, sharpen slew rates and fix capacitance and noise violations in the design.

An optimal buffer library generator module operates to reduce a general buffer library down to a optimal buffer library, hereafter referred to as the pruned buffer library, based on parameters that are input to the optimal buffer library generator module. The parameters received by the optimal buffer library generator may include, for example, the range of resistance values and capacitance values to use in a delay model for identifying buffers to include in the pruned buffer library, the type of buffers to include for use with decoupling loads off critical paths, a diameter threshold for buffer cluster, and the like. These parameters may be input automatically from the design module, based on the particular design specification generated, may be input by a user via an input device, or the like.

Based on these parameters, the optimal buffer library generator module selects buffers from the general buffer library for inclusion in a pruned buffer library. The pruned buffer library is then input to the buffer insertion tool module for use in performing the buffer insertion into the design specification obtained from the design module. The result is an optimized design that is output to the data processing system.

In a preferred embodiment of the present invention, the pruned library is generated by generating a set of superior buffers and inverters and clustering the set of superior buffers. A single buffer is then selected from each cluster for inclusion in the pruned library. The result is a smaller buffer library which will provide approximately the same performance during buffer insertion while reducing the amount of computing time and memory requirements.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
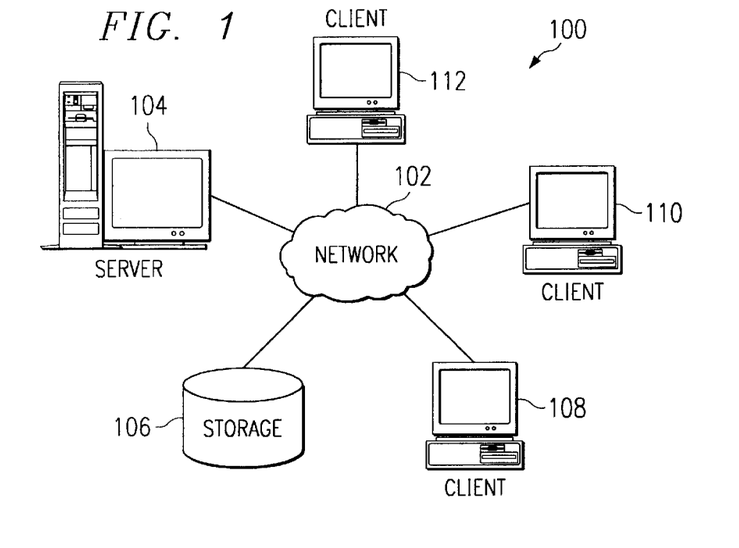
FIG. 1 is a diagram illustrating a distributed data processing system according to the present invention.

With reference now to the figures, and in particular with reference to FIG. 1, a pictorial representation of a distributed data processing system is depicted in which the present invention may be implemented. Distributed data processing system 100 is a network of computers in which the present invention may be implemented. Distributed data processing system 100 contains network 102, which is the medium used to provide communications links between various devices and computers connected within distributed data processing system 100. Network 102 may include permanent connections, such as wire or fiber optic cables, or temporary connections made through telephone connections.

In the depicted example, server 104 is connected to network 102, along with storage unit 106. In addition, clients 108, 110 and 112 are also connected to network 102. These clients, 108, 110 and 112, may be, for example, personal computers or network computers. For purposes of this application, a network computer is any computer coupled to a network which receives an operating system or application program from another computer coupled to the network. In the depicted example, server 104 provides data, such as operating system images and applications, to clients 108–112. Clients 108, 110 and 112 are clients to server 104. Distributed data processing system 100 may include additional servers, clients, and other devices not shown.

In the depicted example, distributed data processing system 100 is the Internet, with network 102 representing a worldwide collection of networks and gateways that use the TCP/IP suite of protocols to communicate with one another. At the heart of the Internet is a backbone of high-speed data communication lines between major nodes or host computers consisting of thousands of commercial, government, education, and other computer systems that route data and messages. Of course, distributed data processing system 100 also may be implemented as a number of different types of networks such as, for example, an intranet or a local area network. FIG. 1 is intended as an example and not as an architectural limitation for the processes of the present invention.

Figure 2:
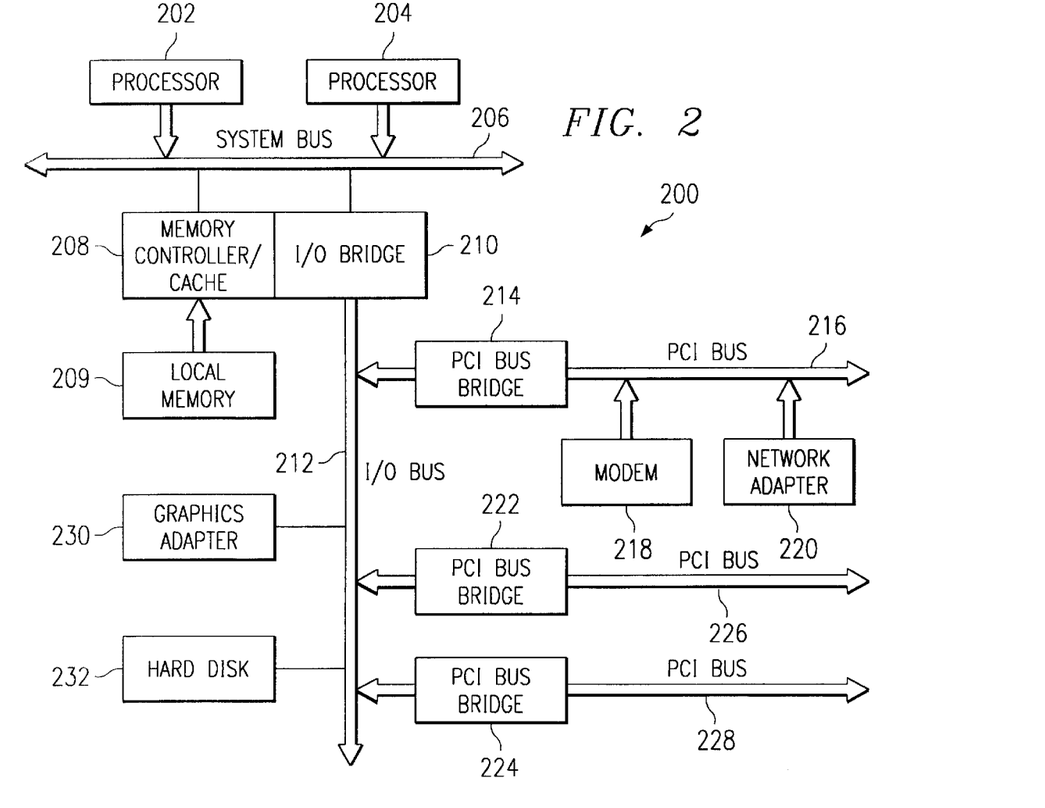
FIG. 2 is an exemplary block diagram of a server according to the present invention.

Referring to FIG. 2, a block diagram of a data processing system which may be implemented as a server, such as server 104 in FIG. 1, is depicted in accordance with the present invention. Data processing system 200 may be a symmetric multiprocessor (SMP) system including a plurality of processors 202 and 204 connected to system bus 206. Alternatively, a single processor system may be employed. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted. Peripheral component interconnect (PCI) bus bridge 214 connected to I/O bus 212 provides an interface to PCI local bus 216. A number of modems 218–220 may be connected to PCI bus 216. Typical PCI bus implementations will support four PCI expansion slots or add-in connectors. Communications links to network computers 108–112 in FIG. 1 may be provided through modem 218 and network adapter 220 connected to PCI local bus 216 through add-in boards. Additional PCI bus bridges 222 and 224 provide interfaces for additional PCI buses 226 and 228, from which additional modems or network adapters may be supported. In this manner, server 200 allows connections to multiple network computers. A memory mapped graphics adapter 230 and hard disk 232 may also be connected to I/O bus 212 as depicted, either directly or indirectly.

Those of ordinary skill in the art will appreciate that the hardware depicted in FIG. 2 may vary. For example; other peripheral devices, such as optical disk drives and the like, also may be used in addition to or in place of the hardware depicted. The depicted example is not meant to imply architectural limitations with respect to the present invention. The data processing system depicted in FIG. 2 may be, for example, an IBM RISC/System 6000, a product of International Business Machines Corporation in Armonk, N.Y., running the Advanced Interactive Executive (AIX) operating system.

Figure 3:
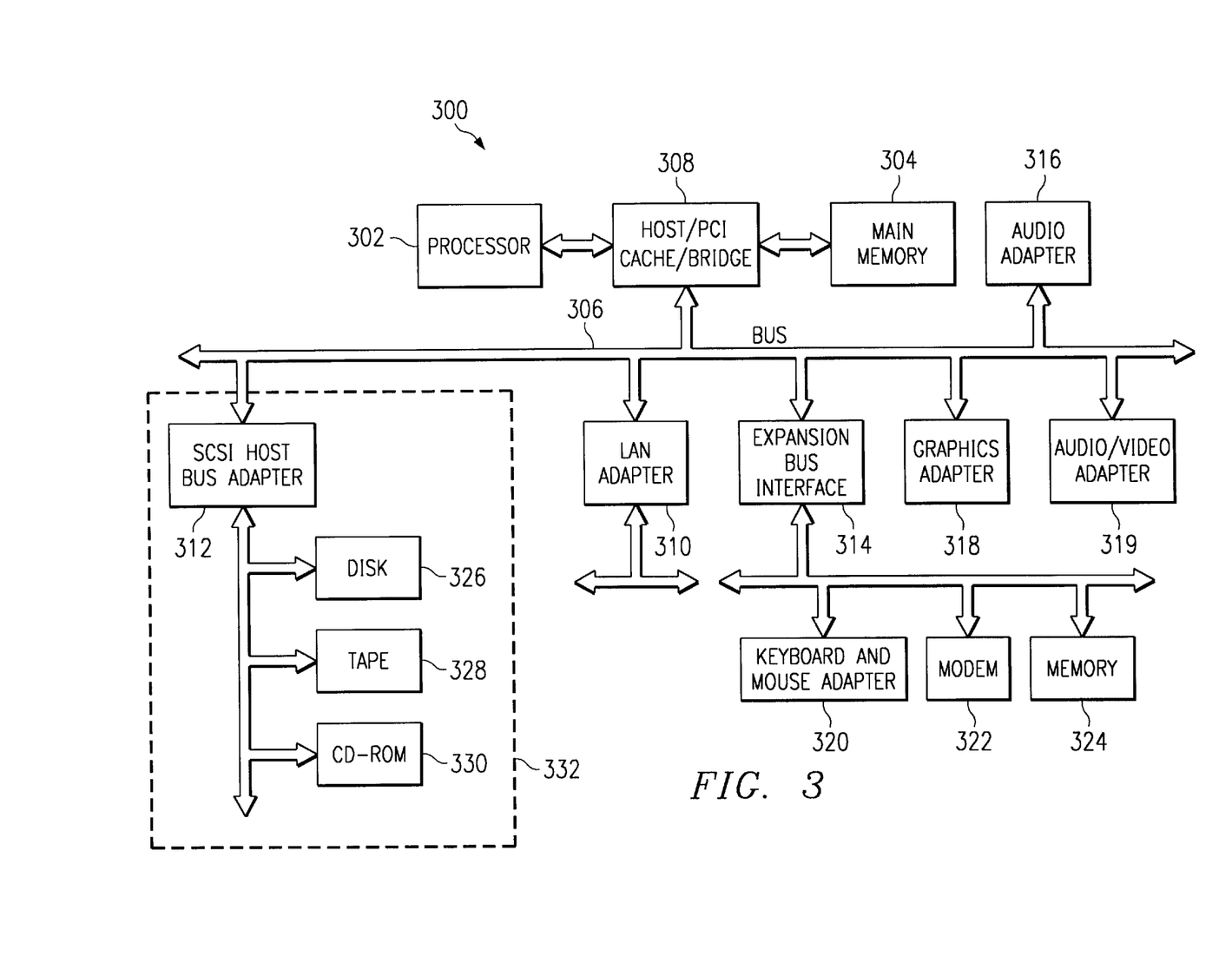
FIG. 3 is an exemplary block diagram of a client according to the present invention.

With reference now to FIG. 3, a block diagram of a data processing system in which the present invention may be implemented is illustrated. Data processing system 300 is an example of a client computer. Data processing system 300 employs a peripheral component interconnect (PCI) local bus architecture. Although the depicted example employs a PCI bus, other bus architectures, such as Micro Channel and ISA, may be used. Processor 302 and main memory 304 are connected to PCI local bus 306 through PCI bridge 308. PCI bridge 308 may also include an integrated memory controller and cache memory for processor 302. Additional connections to PCI local bus 306 may be made through direct component interconnection or through add-in boards. In the depicted example, local area network (LAN) adapter 310, SCSI host bus adapter 312, and expansion bus interface 314 are connected to PCI local bus 306 by direct component connection. In contrast, audio adapter 316, graphics adapter 318, and audio/video adapter (A/V) 319 are connected to PCI local bus 306 by add-in boards inserted into expansion slots. Expansion bus interface 314 provides a connection for a keyboard and mouse adapter 320, modem 322, and additional memory 324.

In the depicted example, SCSI host bus adapter 312 provides a connection for hard disk drive 326, tape drive 328, CD-ROM drive 330, and digital video disc read only memory drive (DVD-ROM) 332. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system, such as OS/2, which is available from International Business Machines Corporation. "OS/2" is a trademark of International Business Machines Corporation.

An object oriented programming system, such as Java, may run in conjunction with the operating system, providing calls to the operating system from Java programs or applications executing on data processing system 300. Instructions for the operating system, the object-oriented operating system, and applications or programs are located on a storage device, such as hard disk drive 326, and may be loaded into main memory 304 for execution by processor 302.

Those of ordinary skill in the art will appreciate that the hardware in FIG. 3 may vary depending on the implementation. For example, other peripheral devices, such as optical disk drives and the like, may be used in addition to or in place of the hardware depicted in FIG. 3. The depicted example is not meant to imply architectural limitations with respect to the present invention. For example, the processes of the present invention may be applied to multiprocessor data processing systems.

The present invention provides a mechanism by which a reduced size buffer library is constructed from a general buffer library stored, for example, in a storage device associated with the computing device on which the present invention is implemented, such as one or more of storage devices 232, 326, 328, 330, 324, or the like. The reduced size buffer library is then utilized with a buffer insertion tool to optimize a chip design.

The present invention may be implemented in a stand alone data processing system or in a distributed data processing system. For example, the present invention may be implemented using a single computing device, such as client device 300. In such an embodiment, the processor 302 would execute the design tool of the present invention with the general buffer library and chip design being stored in a storage device, such as disk 326, tape 328, CD-ROM 330, memory 324, or the like. Parameters for executing the design tool may be input by a user via an input device, such as a keyboard and/or mouse, and keyboard and mouse adapter 320.

Alternatively, the present invention may be implemented in a distributed data processing system, such as distributed data processing system 100 in FIG. 1. In such an embodiment, the design tool may be implemented, for example, on a server, such as server 104, with input and output being received and sent to client devices, such as clients 108–112. The general buffer library and chip design specifications may be stored, for example, on the server, such as server 200, on hard disk 232, or other type of storage device.

The following description of the present invention does not assume either a stand alone or distributed data processing system embodiment. Rather, the following description is applicable to either a stand alone or distributed data processing system, as will be appreciated by those of ordinary skill in the art.

Figure 4:
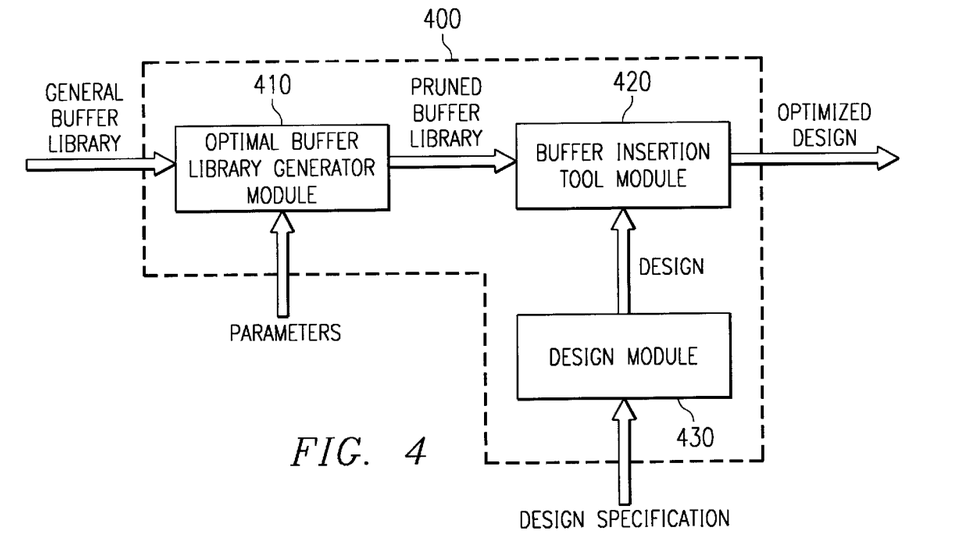
FIG. 4 is an exemplary block diagram of a design optimization tool in accordance with the present invention.

FIG. 4 is an exemplary block diagram illustrating the components of a design tool in accordance with the present invention. As shown in FIG. 4, the design tool 400 includes an optimal buffer library generator module 410, a buffer insertion tool module 420 and a design module 430. The design module 430 and the buffer insertion tool module 420 both operate in a manner generally known in the art.

In summary, the design module 430 receives a high-level design specification from a user and generates a chip design based on the high-level design specification. The design specification is input to a buffer insertion tool module 420 which takes the design specification and inserts appropriate buffers into the design to minimize delay along timing-critical paths, sharpen slew rates and fix capacitance and noise violations in the design.

The optimal buffer library generator module 410 operates to reduce a general buffer library down to a optimal buffer library, hereafter referred to as the pruned buffer library, based on parameters that are input to the optimal buffer library generator module 410. The parameters received by the optimal buffer library generator may include, for example, the range of resistance values and capacitance values to use in a delay model for identifying buffers to include in the pruned buffer library, the type of buffers to include for use with decoupling loads off critical paths, a diameter threshold for buffer cluster, and the like, as will be discussed further hereafter. These parameters may be input automatically from the design module 430, based on the particular design specification generated, may be input by a user via an input device, or the like.

Based on these parameters, the optimal buffer library generator module 410, selects buffers from the general buffer library for inclusion in a pruned buffer library. The pruned buffer library is then input to the buffer insertion tool module 420 for use in performing the buffer insertion into the design specification obtained from the design module 430. The result is an optimized design that is output to the data processing system.

Figure 5:
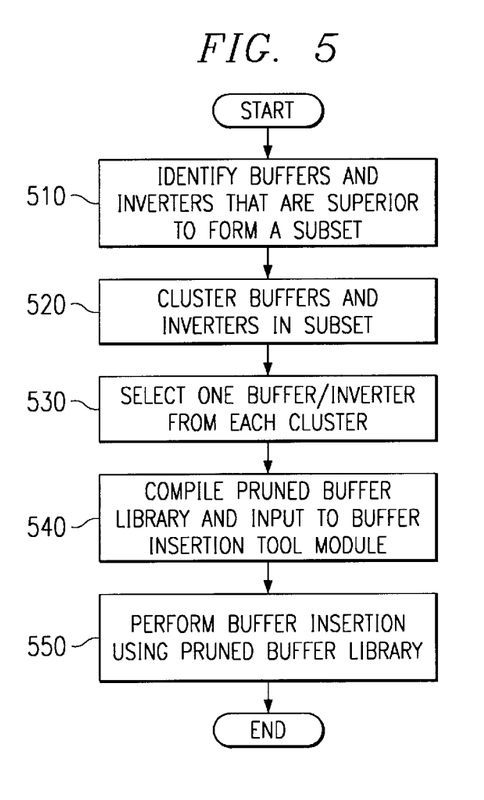
FIG. 5 is a flowchart outlining an exemplary operation of the design optimization tool in accordance with the present invention.

FIG. 5 is a flowchart outlining an exemplary operation of the design tool according to the present invention. As shown in FIG. 5, the operation starts by identifying buffers and inverters that are superior, to form a subset of buffers from the general buffer library (step 510). The buffers in the subset of buffers are then clustered (step 520). One buffer/inverter from each cluster is selected (step 530). The selected buffers/inverters are compiled into a pruned buffer library and input to the buffer insertion tool module (step 540). The buffer insertion tool module performs buffer insertion on the chip design using the pruned buffer library (step 550) and the operation ends.

In selecting a set of buffers for a pruned buffer library from the general buffer library, the present invention finds a smallest buffer library such that the effectiveness of the buffer insertion tool module is approximately the same as if the entire general buffer library were utilized, while reducing the computation time and memory requirements. Effectiveness can be measured in several different ways, e.g., the number of slew violations fixed, the number of capacitance violations fixed, the delay on the most critical path, or some combination of these. The present invention is independent of the particular effectiveness measurement used.

In the present invention, given a buffer b, $C_b$ denotes the input capacitance of b and inv(b) is a boolean function which returns true if b is an inverting buffer and false if b is a non-inverting buffer. $D_b(C,t)$ is defined as a function that returns a delay of buffer b driving a capacitive load C with an input slew rate of t. It is assumed that this delay is the highest of the two delays for input rising and falling edges. The delay function $D_b(C,t)$ may be as simple as a linear gate delay model or as complex as large sets of equations or lookup tables.

In addition, every buffer has a maximum capacitive load which it can drive while still outputting a reasonably shaped waveform. $M_b$ denotes this maximum capacitance that b may drive.

As set forth in FIG. 5, the first step in defining a pruned buffer library is to generate a set of superior buffers and inverters. One technique for identifying superior buffers may be identified by computing delays $D_b(C,t)$ for all the buffers b and for some value of C and t and pick the buffers which yield the lowest delay. However, although the buffer delay would be the lowest, a high buffer input capacitance may slow down the previous stage in the path since the previous driver (and interconnect) becomes heavily loaded.

Figure 9:
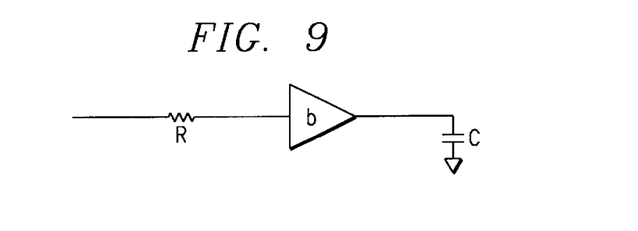
FIG. 9 is an exemplary buffer model for use with the present invention.

An alternative method of identifying fast buffers in the general buffer library would be to hook up the buffer to a resistor in a manner such as shown in FIG. 9. The delay through the network is now defined as $RC_b+D_b(C,t)$, where R is the resistance of the resistor. Of course other methods may be used for determining the superior buffers from the general buffer library without departing from the spirit and scope of the present invention. For example, other circuit models may be utilized for determining the delay rather than the particular model shown in FIG. 9.

Using this model to identify the superior buffers, the following steps are performed:

1. Initialize set of superior buffers S to null set.
2. For several resistance values R do For several capacitance values C do Find buffers b in the set of all buffers A that minimizes $RC_b+D_b(C,t)$ such that $C<=C_b$ and inv(b)=false. Set S to the union of S with the set of buffers {b}. Find buffers b in the set of all buffers A that minimizes $RC_b+D_b(C,t)$ such that $C<=C_b$ and inv(b)=true. Set S to the union of S with the set of buffers {b}.
3. Add a predetermined number of buffers and inverters with minimum values of $C_b$ into S.
4. Return S.

Thus, with the present invention, the set of superior buffers is first set to a null set. Then, the algorithm iterates over a large range of possible loads and input resistance values. The exact ranges depend on the technology being implemented in the chip design. Thus, the ranges may be specified by the user, by the design module, or the like.

For each iteration, both the inverting and non-inverting buffers which yield the minimum delay when the resistance R and the capacitance C are linked as shown in FIG. 9. These buffers b are considered superior for some values of R and C and thus get preserved. Thereafter, additional buffers having very small input capacitance are added to the set of superior buffers to accommodate decoupling loads off critical paths. The resulting set of superior buffers is then returned by the algorithm.

During the execution of the algorithm described above, some buffers will likely be identified as superior several times. Thus, despite thousands of potential combinations of R and C, only a subset of superior buffers will ever be identified as superior. For example, during testing of the above algorithm, with an initial general buffer library size of 249 buffers, the algorithm, under test conditions, returned a set of superior buffers with only 44 buffers in the set.

While the set of superior buffers may be utilized with the buffer insertion tool itself, it is likely that the set of superior buffers is still larger than is necessary for buffer insertion. For example, some buffers may be superior only once in step 2 above while others may be superior for hundreds of different scenarios. Thus, the present invention may also include a second step of clustering the buffers in the set of superior buffers to identify the minimum set of buffers needed to perform the buffer insertion.

The process of clustering buffers essentially identifies those buffers in the set of superior buffers that are most like one another. If two buffers are similar, then it is likely that only one of these buffers needs to be in the pruned buffer library. In this way, the pruned buffer library is composed of buffers whose characteristics vary widely. For example, one buffer may have a high intrinsic delay, but a low delay value for driving large loads, and another may be fairly small, but fast at driving small loads. Still another might be relatively slow, but have low input capacitance.

In order to identify buffers that are similar, a metric is needed for determining how similar the two buffers b1 and b2 are. One possibility is to look at the differences between $C_{b1}$ and $C_{b2}$ and between $M_{b1}$ and $M_{b2}$. Similar values for input and maximum driving capacitance reveals that the two buffers are roughly the same size. However, the delay characteristics may be very different for buffers of the same size.

Since delay is a function and not a scalar value, the delay of two buffers cannot be directly compared. The present invention solves this problem by approximating the delay $D_b(C,t)$ by a linear function $R_bC+K_b$, where $K_b$ is the y-intercept, i.e. intrinsic delay, and $R_b$ is the slope, i.e. driver resistance. Since resistance decreases with size while the other values $C_b$, $M_b$, $K_b$ tend to increase with size, the conductance $g_b=1/R_b$ is used. Hence, the characteristics of each buffer b are characterized by the 4-tuple ($C_b$, $M_b$, $K_b$, $g_b$)

If $C_{max}=\max\{C_b|b \in S\}$, and $M_{max}$, $K_{max}$ and $g_{max}$ are similarly defined, the distance in the scaled 4-dimensional buffer space between $b_1$ and $b_2$ is given by:

$$Dist(b1, b2)=sqrt\{((C_{b1}-C_{b2})/C_{max})^2+((M_{b1}-M_{b2})/M_{max})^2+((K_{b1}-K_{b2})/K_{max})^2+((g_{b1}-g_{b2})/g_{max})^2\}$$

The purpose of scaling each coordinate by its corresponding maximum value is to ensure that each buffer lies in the space $[0,1]^4$ so that none of the four parameters dominates the others. Without this scaling, the $M_b$ parameter would likely dominate the $C_b$ parameter since the ranges of input capacitance are typically much smaller than those of driving capacitances. Furthermore, by scaling in this manner, the distance is independent of the respective units of each parameter.

Given this distance metric, a set of buffers that are most dissimilar to each other is identified. In order to identify the set of buffers that are most dissimilar to one another, clustering of the buffers is first performed and then a single buffer from each cluster is selected. In this way, the selected buffers will be most dissimilar to one another in the final resulting set. The size of the buffer library containing the selected buffers may be controlled through a user specified parameter D. The larger the value for D, the smaller the number of clusters and the smaller the size of the buffer library.

In order to perform the clustering of buffers and selection of a single buffer from each cluster, the following steps are implemented:

1. Choose a random buffer b ∈ S such that dist(b,b') is maximum. Let W={b'} and let d=max{dist(b,b')|b ∈ S}.
2. While d>diameter threshold D, do Find b'∈ S/W such that d=min{dist(b,b')|b ∈ W} is maximized. Set W to the union of W with {b'}.
3. Relabel buffers in W as $\{w_1, w_2, \ldots, w_k\}$. Let $C_k=\{C_1, C_2, \ldots, C_k\}$ be a k-way clustering where $C_i=\{w_i\}$ for $1<=i<=k$.
4. For each b ∈ S/W, do Find the cluster center $w_i$ ∈ W such that dist(b,$w_i$) is minimized. Add b to cluster $C_i$.
5. For each cluster $C_i$, do Find b' ∈ $C_i$ such that max{dist(b,b')|b ∈ $C_i$} is minimized. Add b' to pruned buffer library.
6. Return pruned buffer library.

Thus, the present invention picks a random buffer and identifies the buffer that is furthest away which is on the periphery of the data set. This identifies one cluster center which is contained in the set W (step 1). More cluster centers are identified iteratively by finding the center that is furthest away from the other centers already identified (step 2). Each buffer is assigned to the cluster corresponding to its closest center (steps 3 and 4). Once the buffers are assigned to clusters, the true center of each cluster is identified (step 5). This is done by checking each buffer in each cluster to determine the buffer that has the smallest distance to the furthest buffer within the cluster. This buffer is added to the pruned buffer library. The pruned buffer library is then returned (step 6).

While the above algorithms are used in a preferred embodiment of the present invention, the present invention is not limited to the particular algorithm described. Rather, any algorithms that provide for the selection of a subset of buffers from a general buffer library for use with a buffer insertion tool may be used without departing from the spirit and scope of the present invention.

Thus, the present invention provides a mechanism by which an optimized set of buffers is identified for use with a buffer insertion tool. Specifically, in a preferred embodiment of the present invention, a pruned buffer library is generated by identifying a set of superior buffers from a general buffer library, clustering these superior buffers, and selecting a buffer at the center of each cluster for inclusion in the pruned buffer library. By making use of this pruned buffer library, the computational time and memory requirements necessary to perform buffer insertion may be greatly reduced in comparison with prior art methods of buffer insertion.

Figure 6:
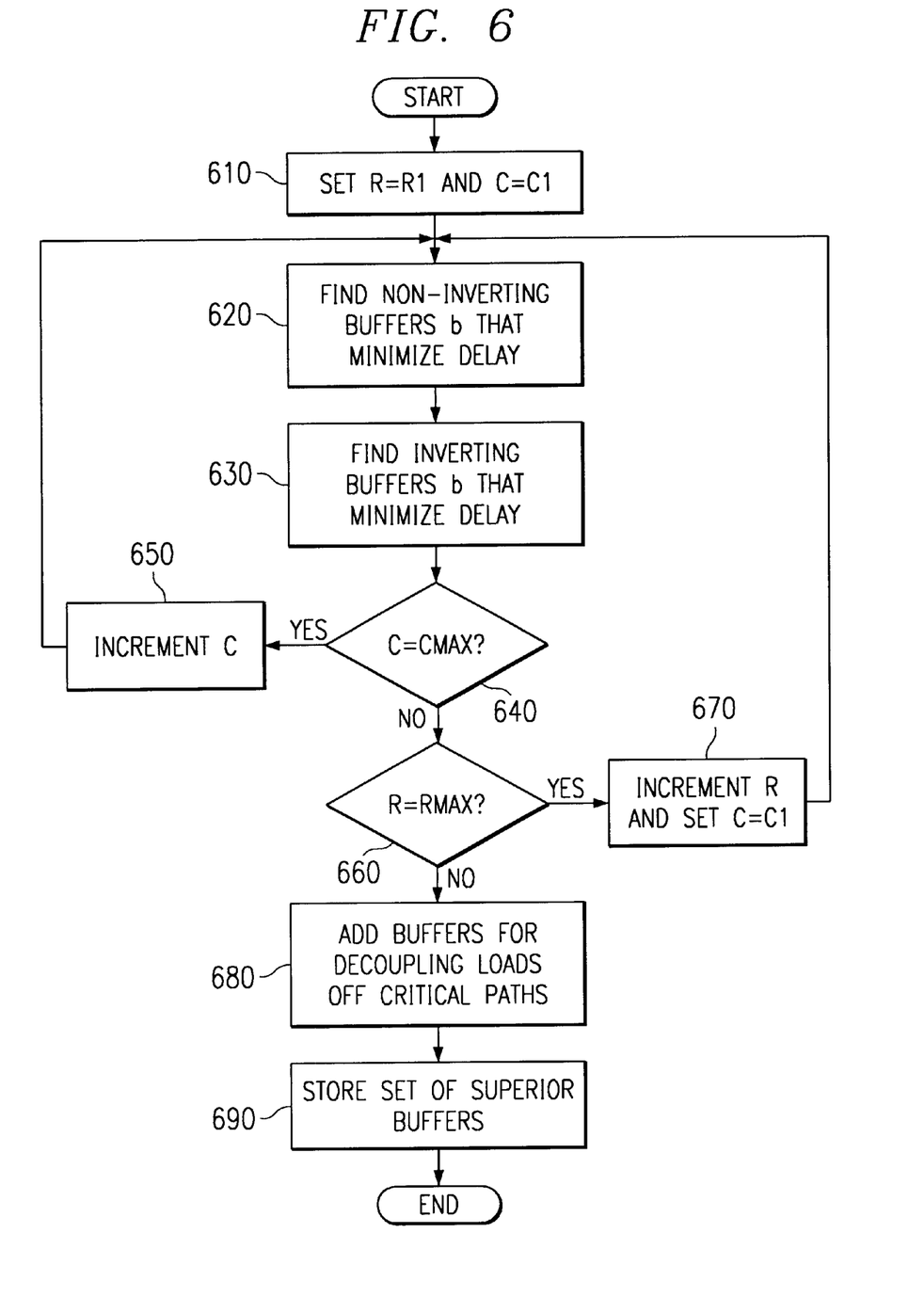
FIG. 6 is a flowchart outlining an exemplary operation of the present invention for generating a set of superior buffers from a general buffer library.

FIG. 6 is a flowchart outlining an exemplary operation of the present invention when generating a set of superior buffers. The flowchart shown in FIG. 6 corresponds to step 510 in FIG. 5.

As shown in FIG. 6, the operation starts by setting a resistance to a first resistance value and a capacitance to a first capacitance value (step 610). Non-inverting buffers that minimize delay (step 620) and inverting buffers that minimize delay (step 630) are identified from a general buffer library and added to the set of superior buffers.

A determination is made as to whether the capacitance value is the maximum capacitance value for a range of capacitance values (step 640). If not, the capacitance value is incremented to the next capacitance value in the range of capacitance values (step 650). If so, a determination is made as to whether the resistance value is a maximum resistance value for a range of resistance values (step 660). If not, the resistance value is incremented to a next resistance value in the range of resistance values, the capacitance is reset to a first capacitance value (step 670), and the operation returns to step 620.

If the resistance is a maximum resistance value, buffers are added to the set of superior buffers (step 680). Thereafter, the set of superior buffers is stored in memory (step 690).

Figure 7:
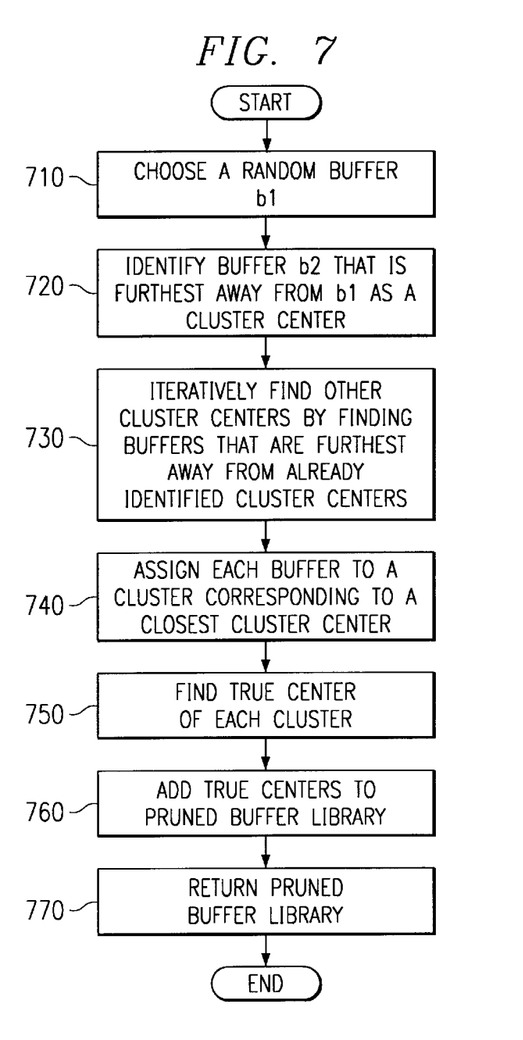
FIG. 7 is a flowchart outlining an exemplary operation of the present invention for generating a pruned buffer library from a set of superior buffers.

FIG. 7 is a flowchart outlining an exemplary operation of the present invention when clustering the buffers in the set of superior buffers and selecting a buffer from each cluster. As shown in FIG. 7, the operation starts by choosing a random buffer b1 (step 710). A buffer b2 is identified as a cluster center that is furthest away from b1 (step 720).

Other cluster centers are iteratively identified by finding the buffers that are furthest away from already identified cluster centers (step 730). Once cluster centers are identified, each buffer in the set of superior buffers is assigned to a cluster (step 740).

The true center of each cluster is then determined (step 750) and added to the pruned buffer library (step 760). The pruned buffer library is then returned for use with a buffer insertion tool (step 770).

Figure 8A:
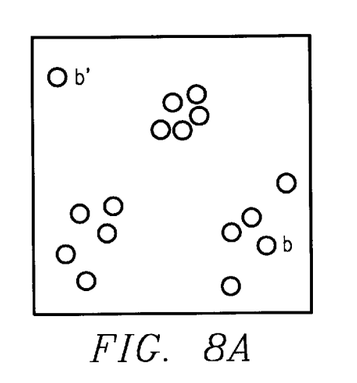
FIGS. 8A–D are exemplary diagrams illustrating the operation of generating a pruned buffer library from a set of superior buffers.
Figure 8B:
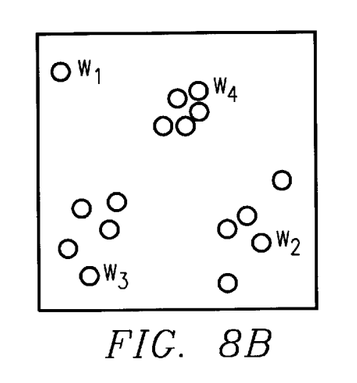
Figure 8C:
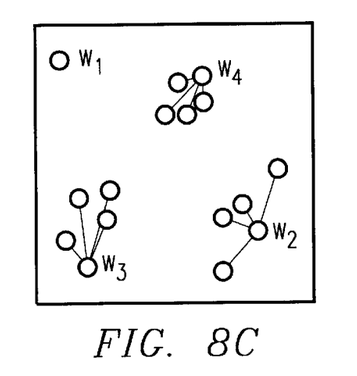
Figure 8D:
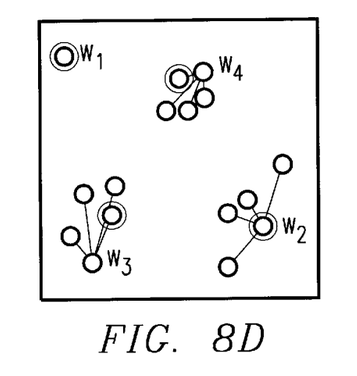

FIGS. 8A–D are graphical depictions demonstrating the steps of the preferred embodiment for clustering the buffers in the set of superior buffers. FIG. 8A shows the step of randomly selecting a buffer b and then selecting another buffer b' that is furthest away from b. FIG. 8B shows the step of identifying a plurality of other cluster centers $w_1$–$w_4$. FIG. 8C shows the step of assigning buffers to clusters. FIG. 8D shows the step of identifying the true cluster centers for each cluster (the true cluster centers are circled).

Thus, the present invention provides a mechanism by which a reduced size buffer library is identified for use with a buffer insertion tool. The reduced size buffer library reduces the amount of computational time and storage capacity necessary to perform the buffer insertion process.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, CD-ROMs, and transmission-type media such as digital and analog communications links.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of generating an optimized buffer library for buffer insertion, comprising:

selecting buffers from a general buffer library that meet a criteria;

grouping the selected buffers into a plurality of groups; and selecting a buffer from each group for inclusion in the optimized buffer library.

2. The method of claim 1, wherein selecting buffers from a general buffer library that meet a criteria includes receiving parameters identifying the criteria from one of a design module and an input from a user.

3. The method of claim 1, wherein selecting buffers from a general buffer library that meet a criteria includes selecting buffers from the general buffer library based on a plurality of capacitive loads and input slew rates.

4. The method of claim 3, wherein selecting buffers from a general buffer library that meet a criteria includes selecting buffers whose delay is a minimum for each combination of the plurality of capacitive loads and input slew rates.

5. The method of claim 3, wherein selecting buffers from a general buffer library that meet a criteria further includes selecting buffers having very small input capacitance to accommodate decoupling loads off critical paths.

6. A method of generating an optimized buffer library for buffer insertion, comprising:

selecting buffers from a general buffer library that meet a criteria;

grouping the selected buffers into a plurality of groups; and selecting a buffer from each group for inclusion in the optimized buffer library, wherein grouping the selected buffers into a plurality of groups includes identifying buffers from the selected buffers that are most like one another with regard to their characteristics and assigning them to the same group.

7. The method of claim 6, wherein identifying buffers from the selected buffers that are most like one another includes identifying buffers based on a difference in one of input capacitance and maximum driving capacitance.

8. The method of claim 6, wherein identifying buffers from the selected buffers that are most like one another includes:

choosing a first buffer from the selected buffers;

identifying a second buffer from the selected buffers that is the most different from the first buffer;

adding the first and second buffers to a list of virtual cluster centers, the virtual cluster centers being a first estimate of the center of corresponding clusters;

identifying other buffers from the selected buffers that are furthest away from the virtual cluster centers in the list of virtual cluster centers; and adding the other buffers to the list of virtual cluster centers.

9. The method of claim 8, wherein identifying buffers from the selected buffers that are most like one another further includes:

assigning buffers from the selected buffers to one of the clusters corresponding to a virtual cluster center based on a similarity of the buffers to the virtual cluster center.

10. The method of claim 8, wherein identifying buffers from the selected buffers that are most like one another further includes identifying a true cluster center for each of the clusters, and wherein selecting a buffer from each group for inclusion in the optimized buffer library includes selecting the true cluster center for each cluster for inclusion in the optimized buffer library.

11. The method of claim 6, wherein identifying buffers from the selected buffers that are most like one another includes identifying the buffers based on a linear approximation of a delay property of each of the buffers from the selected buffers.

12. The method of claim 11, wherein the linear approximation of the delay property is $D_b(C,t)=R_b C+K_b$, wherein $D_b$ is the delay for buffer b, C is a capacitance, t is an input slew rate, $R_b$ is the resistance of buffer b, and $K_b$ is the intrinsic delay of buffer b.

13. The method of claim 8, wherein identifying a second buffer and identifying other buffers is performed based on the following relationship:

$$Dist(b1,b2)=sqrt\{((C_{b1}-C_{b2})/C_{max})^2+((M_{b1}-M_{b2})/M_{max})^2+((K_{b1}-K_{b2})/K_{max})^2+((g_{b1}-g_{b2})/g_{max})^2\}$$

Where $Dist(b1,b2)$ is the distance between buffer b1 and buffer b2 in a four dimensional buffer space, $C_{b1}$ and $C_{b2}$ are a capacitance of buffers b1 and b2, $C_{max}$ is a maximum capacitance for the selected buffers, $M_{b1}$ and $M_{b2}$ are a maximum capacitance for buffers b1 and b2, $M_{max}$ is a maximum capacitance for the selected buffers, $K_{b1}$ and $K_{b2}$ are the intrinsic delays of buffers b1 and b2, $K_{max}$ is the maximum intrinsic delay for the selected buffers, $g_{b1}$ and $g_{b2}$ are the conductance of buffers b1 and b2, and $g_{max}$ is the maximum conductance of the selected buffers.

14. The method of claim 1, wherein selecting buffers from a general buffer library that meet a criteria includes:

setting a resistance value;

setting a capacitance value;

identifying inverting and non-inverting buffers from the general buffer library that minimize delay based on the resistance value and the capacitance value; and repeating the setting steps and the identifying step for each of a plurality of resistance and capacitance values.

15. A method of generating an optimized buffer library for buffer insertion, comprising:

selecting buffers from a general buffer library that meet a criteria;

grouping the selected buffers into a plurality of groups; and selecting a buffer from each group for inclusion in the optimized buffer library, wherein grouping the selected buffers into a plurality of groups includes:

identifying a first cluster center;

identifying a second cluster center as a buffer that is furthest away from the first cluster center in a buffer space;

iteratively identifying other cluster centers by finding buffers that are furthest away from already identified cluster centers in the buffer space; and assigning buffers from the selected buffers to clusters associated with the identified cluster centers.

16. The method of claim 1, further comprising using the optimized buffer library to perform buffer insertion in a chip design.

17. A computer program product in a computer readable medium for generating an optimized buffer library for buffer insertion, comprising:

first instructions for selecting buffers from a general buffer library that meet a criteria;

second instructions for grouping the selected buffers into a plurality of groups; and third instructions for selecting a buffer from each group for inclusion in the optimized buffer library.

18. The computer program product of claim 17, wherein the first instructions for selecting buffers from a general buffer library that meet a criteria include instructions for receiving parameters identifying the criteria from one of a design module and an input from a user.

19. The computer program product of claim 17, wherein the first instructions for selecting buffers from a general buffer library that meet a criteria include instructions for selecting buffers from the general buffer library based on a plurality of capacitive loads and input slew rates.

20. The computer program product of claim 19, wherein the first instructions for selecting buffers from a general buffer library that meet a criteria include instructions for selecting buffers whose delay is a minimum for each combination of the plurality of capacitive loads and input slew rates.

21. The computer program product of claim 19, wherein the first instructions for selecting buffers from a general buffer library that meet a criteria further include instructions for selecting buffers having very small input capacitance to accommodate decoupling loads off critical paths.

22. A computer program product in a computer readable medium for generating an optimized buffer library for buffer insertion, comprising:

first instructions for selecting buffers from a general buffer library that meet a criteria;

second instructions for grouping the selected buffers into a plurality of groups; and third instructions for selecting a buffer from each group for inclusion in the optimized buffer library, wherein the second instructions for grouping the selected buffers into a plurality of groups include instructions for identifying buffers from the selected buffers that are most like one another with regard to their characteristics and assigning them to the same group.

23. The computer program product of claim 22, wherein the instructions for identifying buffers from the selected buffers that are most like one another include instructions for identifying buffers based on a difference in one of input capacitance and maximum driving capacitance.

24. The computer program product of claim 22, wherein the instructions for identifying buffers from the selected buffers that are most like one another includes:
   instructions for choosing a first buffer from the selected buffers;
   instructions for identifying a second buffer from the selected buffers that is the most different from the first buffer;
   instructions for adding the first and second buffers to a list of virtual cluster centers, the virtual cluster centers being a first estimate of the center of corresponding clusters;
   instructions for identifying other buffers from the selected buffers that are furthest away from the virtual cluster centers in the list of virtual cluster centers; and
   instructions for adding the other buffers to the list of virtual cluster centers.

25. The computer program product of claim 24, wherein the instructions for identifying buffers from the selected buffers that are most like one another further includes:
   instructions for assigning buffers from the selected buffers to one of the clusters corresponding to a virtual cluster center based on a similarity of the buffers to the virtual cluster center.

26. The computer program product of claim 24, wherein the instructions for identifying buffers from the selected buffers that are most like one another further include instructions for identifying a true cluster center for each of the clusters, and wherein the third instructions for selecting a buffer from each group for inclusion in the optimized buffer library include instructions for selecting the true cluster center for each cluster for inclusion in the optimized buffer library.

27. The computer program product of claim 22, wherein the instructions for identifying buffers from the selected buffers that are most like one another include instructions for identifying the buffers based on a linear approximation of a delay property of each of the buffers from the selected buffers.

28. The computer program product of claim 27, wherein the linear approximation of the delay property is $D_b(C,t) = R_b C + K_b$, wherein $D_b$ is the delay for buffer b, C is a capacitance, t is an input slew rate, $R_b$ is the resistance of buffer b, and $K_b$ is the intrinsic delay of buffer b.

29. The computer program product of claim 24, wherein the instructions for identifying a second buffer and instructions for identifying other buffers is performed based on the following relationship:

$$Dist(b1,b2) = sqrt\{((C_{b1}-C_{b2})/C_{max})^2 + ((M_{b1}-M_{b2})/M_{max})^2 + ((K_{b1}-K_{b2})/K_{max})_2 + ((g_{b1}-g_{b2})/g_{max})^2\}$$

where Dist(b1,b2) is the distance between buffer b1 and buffer b2 in a four dimensional buffer space, $C_{b1}$ and $C_{b2}$ are a capacitance of buffers b1 and b2, $C_{max}$ is a maximum capacitance for the selected buffers, $M_{b1}$ and $M_{b2}$ are a maximum capacitance for buffers b1 and b2, $M_{max}$ is a maximum capacitance for the selected buffers, $K_{b1}$ and $K_{b2}$ are the intrinsic delays of buffers b1 and b2, $K_{max}$ is the maximum intrinsic delay for the selected buffers, $g_{b1}$ and $g_{b2}$ are the conductance of buffers b1 and b2, and $g_{max}$ is the maximum conductance of the selected buffers.

30. The computer program product of claim 17, wherein the first instructions for selecting buffers from a general buffer library that meet a criteria includes:
   instructions for setting a resistance value;
   instructions for setting a capacitance value;
   instructions for identifying inverting and non-inverting buffers from the general buffer library that minimize delay based on the resistance value and the capacitance value; and
   instructions for repeating the setting steps and the identifying step for each of a plurality of resistance and capacitance values.

31. A computer program product in a computer readable medium for generating an optimized buffer library for buffer insertion, comprising:
   first instructions for selecting buffers from a general buffer library that meet a criteria;
   second instructions for grouping the selected buffers into a plurality of groups; and
   third instructions for selecting a buffer from each group for inclusion in the optimized buffer library, wherein the second instructions for grouping the selected buffers into a plurality of groups includes:
      instructions for identifying a first cluster center;
      instructions for identifying a second cluster center as a buffer that is furthest away from the first cluster center in a buffer space;
      instructions for iteratively identifying other cluster centers by finding buffers that are furthest away from already identified cluster centers in the buffer space; and
      instructions for assigning buffers from the selected buffers to clusters associated with the identified cluster centers.

32. An apparatus for generating an optimized buffer library for buffer insertion, comprising:
   a general buffer library storage device; and
   an optimal buffer library generator coupled to the general buffer library storage device, wherein the optimal buffer library generator selects buffers from a general buffer library, stored in the general buffer library storage device, that meet a criteria, groups the selected buffers into a plurality of groups, and selects a buffer from each group for inclusion in the optimized buffer library.

33. The apparatus of claim 32, wherein the optimal buffer library generator receives parameters identifying the criteria from one of a design module and an input from a user.

34. The apparatus of claim 32, wherein the optimal buffer library generator selects buffers from a general buffer library that meet a criteria by selecting buffers from the general buffer library based on a plurality of capacitive loads and input slew rates.

35. The apparatus of claim 34, wherein the optimal buffer library generator selects buffers from a general buffer library that meet a criteria by selecting buffers whose delay is a minimum for each combination of the plurality of capacitive loads and input slew rates.

36. The apparatus of claim 34, wherein the optimal buffer library generator selects buffers from a general buffer library that meet a criteria by further selecting buffers having very small input capacitance to accommodate decoupling loads off critical paths.

37. An apparatus for generating an optimized buffer library for buffer insertion, comprising:
   a general buffer library storage device; and
   an optimal buffer library generator coupled to the general buffer library storage device, wherein the optimal buffer library generator selects buffers from a general buffer library, stored in the general buffer library storage device, that meet a criteria, groups the selected buffers into a plurality of groups, and selects a buffer from each group for inclusion in the optimized buffer library, wherein the optimal buffer library generator groups the selected buffers into a plurality of groups by identifying buffers from the selected buffers that are most like one another with regard to their characteristics and assigning them to the same group.

38. The apparatus of claim 37, wherein the optimal buffer library generator identifies buffers from the selected buffers that are most like one another by identifying buffers that are most alike based on a difference in one of input capacitance and maximum driving capacitance.

39. The apparatus of claim 37, wherein the optimal buffer library generator identifies buffers from the selected buffers that are most like one another by:

choosing a first buffer from the selected buffers;

identifying a second buffer from the selected buffers that is the most different from the first buffer;

adding the first and second buffers to a list of virtual cluster centers, the virtual cluster centers being a first estimate of the center of corresponding clusters;

identifying other buffers from the selected buffers that are furthest away from the virtual cluster centers in the list of virtual cluster centers; and adding the other buffers to the list of virtual cluster centers.

40. The apparatus of claim 39, wherein the optimal buffer library generator identifies buffers from the selected buffers that are most like one by further assigning buffers from the selected buffers to one of the clusters corresponding to a virtual cluster center based on a similarity of the buffers to the virtual cluster center.

41. The apparatus of claim 39, wherein the optimal buffer library generator identifies buffers from the selected buffers that are most like one another by further identifying a true cluster center for each of the clusters, and wherein the optimal buffer library generator selects a buffer from each group for inclusion in the optimized buffer library by selecting the true cluster center for each cluster for inclusion in the optimized buffer library.

42. The apparatus of claim 37, wherein the optimal buffer library generator identifies buffers from the selected buffers that are most like one another by identifying the buffers based on a linear approximation of a delay property of each of the buffers from the selected buffers.

43. The apparatus of claim 42, wherein the linear approximation of the delay property is $D_b(C,t)=R_bC+K_b$, wherein $D_b$ is the delay for buffer b, C is a capacitance, t is an input slew rate, $R_b$ is the resistance of buffer b, and $K_b$ is the intrinsic delay of buffer b.

44. The apparatus of claim 39, wherein the optimal buffer library generator identifies a second buffer and identifies other buffers based on the following relationship:

$$Dist(b1,b2)=sqrt\{((C_{b1}-C_{b2})/C_{max})^2+((M_{b1}-M_{b2})/M_{max})^2+((K_{b1}-K_{b2})/K_{max})^2+((g_{b1}-g_{b2})/g_{max})^2\}$$

where Dist(b1,b2) is the distance between buffer b1 and buffer b2 in a four dimensional buffer space, $C_{b1}$ and $C_{b2}$ are a capacitance of buffers b1 and b2, $C_{max}$ is a maximum capacitance for the selected buffers, $M_{b1}$ and $M_{b2}$ are a maximum capacitance for buffers b1 and b2, $M_{max}$ is a maximum capacitance for the selected buffers, $K_{b1}$ and $K_{b2}$ are the intrinsic delays of buffers b1 and b2, $K_{max}$ is the maximum intrinsic delay for the selected buffers, $g_{b1}$ and $g_{b2}$ are the conductance of buffers b1 and b2, and $g_{max}$ is the maximum conductance of the selected buffers.

45. The apparatus of claim 32, wherein the optimal buffer library generator selects buffers from a general buffer library that meet a criteria by:

setting a resistance value;

setting a capacitance value;

identifying inverting and non-inverting buffers from the general buffer library that minimize delay based on the resistance value and the capacitance value; and repeating the setting steps and the identifying step for each of a plurality of resistance and capacitance values.

46. An apparatus for generating an optimized buffer library for buffer insertion, comprising:

a general buffer library storage device; and an optimal buffer library generator coupled to the general buffer library storage device, wherein the optimal buffer library generator selects buffers from a general buffer library, stored in the general buffer library storage device, that meet a criteria, groups the selected buffers into a plurality of groups, and selects a buffer from each group for inclusion in the optimized buffer library, wherein the optimal buffer library generator groups the selected buffers into a plurality of groups by:

identifying a first cluster center;

identifying a second cluster center as a buffer that is furthest away from the first cluster center in a buffer space;

iteratively identifying other cluster centers by finding buffers that are furthest away from already identified cluster centers in the buffer space; and assigning buffers from the selected buffers to clusters associated with the identified cluster centers.

47. The apparatus of claim 32, further comprising a buffer insertion tool, wherein the optimized buffer library is provided to the buffer insertion tool to perform buffer insertion on a chip design.

* * * * *